(12) United States Patent
Reohr

(10) Patent No.: US 7,804,710 B2
(45) Date of Patent: Sep. 28, 2010

(54) MULTI-LAYER MAGNETIC RANDOM ACCESS MEMORY USING SPIN-TORQUE MAGNETIC TUNNEL JUNCTIONS AND METHOD FOR WRITE STATE OF THE MULTI-LAYER MAGNETIC RANDOM ACCESS MEMORY

(75) Inventor: William R. Reohr, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 12/059,504

(22) Filed: Mar. 31, 2008

(65) Prior Publication Data

US 2009/0244965 A1    Oct. 1, 2009

(51) Int. Cl.
*G11C 11/15* (2006.01)
*G11C 11/00* (2006.01)
*G11C 11/14* (2006.01)

(52) U.S. Cl. .................. 365/173; 365/158; 365/171
(58) Field of Classification Search ............. 365/158, 365/173
See application file for complete search history.

(56) References Cited

U.S. PATENT DOCUMENTS

| | | | |
|---|---|---|---|
| 6,335,890 B1 | 1/2002 | Reohr et al. | |
| 6,795,334 B2 * | 9/2004 | Iwata et al. | 365/158 |
| 6,819,586 B1 | 11/2004 | Anthony et al. | |
| 6,961,261 B2 * | 11/2005 | Iwata | 365/158 |
| 7,042,753 B2 * | 5/2006 | Horiguchi | 365/130 |
| 7,075,818 B2 | 7/2006 | Ju | |
| 7,166,881 B2 | 1/2007 | Lin et al. | |
| 7,173,848 B2 | 2/2007 | Ju | |
| 7,285,836 B2 | 10/2007 | Ju et al. | |
| 7,286,421 B2 | 10/2007 | Abraham et al. | |
| 7,301,800 B2 * | 11/2007 | Frey | 365/158 |
| 7,307,874 B2 * | 12/2007 | Jeong et al. | 365/158 |
| 7,372,722 B2 * | 5/2008 | Jeong et al. | 365/158 |
| 7,463,509 B2 * | 12/2008 | Kim et al. | 365/158 |
| 2002/0140060 A1 * | 10/2002 | Asao et al. | 257/661 |
| 2003/0198080 A1 * | 10/2003 | Iwata | 365/158 |
| 2005/0195673 A1 * | 9/2005 | Asao et al. | 365/222 |
| 2007/0097736 A1 | 5/2007 | Inokuchi et al. | |

OTHER PUBLICATIONS

Kochan Ju et al., "Oppositely Biased Multibit Cells for Toggle Magnetic Random Access Memory", IEEE Transactions on Magnetics, col. 43, No. 6, Jun. 2007, pp. 2340-2342.

Hiromitsu Kimura et al., "A Study of Multiple-Valued Magnetoresistive RAM (MRAM) Using Binary MTJ Devices", Proceedings of the 34th International Symposium on Multiple-Valued Logic (ISMVL'04), IEEE Computer Society, May 19-22, 2004, pp. 340-345.

* cited by examiner

*Primary Examiner*—Son L Mai
(74) *Attorney, Agent, or Firm*—Cantor Colburn LLP; Brian Verminski

(57) ABSTRACT

A stacked magnetic tunnel junction (MTJ) structure of a multi-layer magnetic random access memory (MRAM) which includes a plurality of stacked MTJ devices serially connected to each other and an access transistor shared between the stacked MTJ devices. The stacked MTJ structure further includes a write word line through which a write current flows. The write current generates a hard axis magnetic field used to selectively write an MTJ device of the stacked MTJ devices.

18 Claims, 9 Drawing Sheets

MULTI-LAYER MAGNETIC RANDOM ACCESS MEMORY USING SPIN-TORQUE MAGNETIC TUNNEL JUNCTIONS AND METHOD FOR WRITE STATE OF THE MULTI-LAYER MAGNETIC RANDOM ACCESS MEMORY

BACKGROUND OF THE INVENTION

This invention relates generally to a multi-layer magnetic random access memory (MRAM) device using spin-torque magnetic tunnel junction (MTJ) devices and a method to write state into a subset of the MTJ devices. In particular, stacked MTJ devices within the multi-layer MRAM device are written selectively using a combination of a hard axis magnetic field (i.e., hard magnetization) and spin injection.

Conventionally, an MTJ device is used as a memory element in a MRAM device. The MTJ device is a magnetoresistive device having a resistance that can be changed by an applied magnetic field. A binary data '1' or '0' is stored in the MTJ device by changing the resistance thereof to "high" or "low", respectively. The resistivity of the MTJ device is determined by the direction of the magnetic field in the free layer of the MTJ device.

One problem with commercially available MRAM technology is that the size of the memory cell cannot be reduced without increasing the current used to write the MTJ device. Recently, a write method using a spin injection magnetization reversal process has been employed that may help to overcome some of the noted scaling issues related to the write current. Spin-polarized electrons (i.e., spin-injection currents) are injected directly into the magnetic recording layer of the MTJ device to reverse the magnetization of the magnetic recording layer. The spin-injection currents, however, still need to be reduced in order to achieve a compact memory cell due to the fact that the write current passes directly through the MTJ device and its associated selection transistor. Hence, the associated selection transistor may limit the memory cell size.

FIG. 1 is a circuit diagram illustrating a conventional spin-torque MRAM device. As shown in FIG. 1, a memory cell array 20 includes a single MTJ device which is connected to an upper bit line BLu, and a lower bit line BLd via a transistor Tr. As shown in FIG. 1, during a write operation of the MRAM, a word line WL is set at high by the word line driver WD and the transistor Tr is turned on. When a binary '1' is written in the MTJ device, control signals A and B are set to low "L" and the control signals C and D are set to high. Since the transistors P1 and N2 turn on, a spin-injection current Is flows through the MTJ device in a direction from a driver/sinker 25 to a driver/sinker 30. In addition, the control signal E is set to low, and the control signal F is set to high, and the assist current Ia is passed through a write assistance line AL from a driver 35 to a sinker 40. The assist current Ia generates an assist magnetic field in the direction of the hard magnetization of the MTJ device. When "0" is written into the MTJ device, control signals A and B are set to high, control signals C and D are set to low. The transistors P2 and N1 turn on and the spin-injection current Is flows through the MTJ in a direction from the driver/sinker 30 to the driver/sinker 25. In addition, the control signal E is set to low and the control signal F is set to high and the assist current Ia directed from the driver 35 toward the sinker 40 is passed through the write assist line AL. Again the assist current Ia generates the assist magnetic field in the direction of the hard magnetization of the MTJ device. This conventional spin-injection magnetization reversal method uses the assist magnetic field in the direction of the hard magnetization to lower the potential barrier of the MTJ device so that it can be written with less spin-injection current.

It would be desirable to stack layers of these conventional MTJ devices one upon another to form a more compact memory cell overall. Unfortunately though, any applied magnetic field used to assist the in the process of writing a stacked MTJ MRAM device may impact MTJ devices on neighboring layers. Therefore, it is also desirable to "zero-out" an impact of the hard axis magnetic field on unselected MTJ devices occupying proximate layers above and below the selected memory cell.

BRIEF SUMMARY OF THE INVENTION

The shortcomings of the prior art are overcome and additional advantages are provided through the provision of a stacked magnetic tunnel junction (MTJ) structure of a multi-layer magnetic random access memory (MRAM) that includes a plurality of stacked MTJ devices serially connected to each other, and an access transistor shared by the stacked MTJ devices. The stacked MTJ structure further includes a write word line through which a write current flows. The write current generates a hard axis magnetic field used to selectively write an MTJ device of the stacked MTJ devices.

Another exemplary embodiment includes a stacked MTJ structure of multi-layer MRAM having first and second layers. The stacked MTJ structure including plurality of stacked MTJ devices serially connected to each other, and a switching network which sources a first current on one of the first or second layers to select an MTJ device of the stacked MTJ devices for writing and sources a second current on the other of the first or second layers to cancel a magnetic field produced by the first current which impinges on an unselected MTJ device of the stacked MTJ devices. The first current is of a greater magnitude than that of the second current.

Another exemplary embodiment includes a write method for selectively writing an MTJ device of stacked MTJ devices. The method including selecting an MTJ device of the stacked MTJ devices for writing data, generating a write current to flow through a first write word line corresponding to the MTJ device selected to generate a hard axis magnetic field which selects the MTJ device for writing, and generating a cancel current to flow through a second write word line corresponding to an unselected MTJ device of the stacked MTJ devices to generate an opposing magnetic field to counterbalance a stray magnetic field of the hard axis magnetic field which impinges on the unselected MTJ device.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

Embodiments of the present invention use a combination of a hard axis magnetic field and a spin-injection current to selectively write an MTJ device of stacked MTJ devices such that the MTJ devices of the stacked MTJ devices may be written independently by a combination of the hard magnetization and the spin-injection current. In addition, embodiments of the present invention disclose a field cancellation operation to be performed on an unselected MTJ device of the stacked MTJ devices to "zero-out" stray magnetic field of the hard axis magnetic field which impinges on the unselected MTJ device.

The present invention enables the stacking of MTJ devices and the reduction of the spin-injection, and, thereby, it enables a compact memory cell.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

Figure 1:
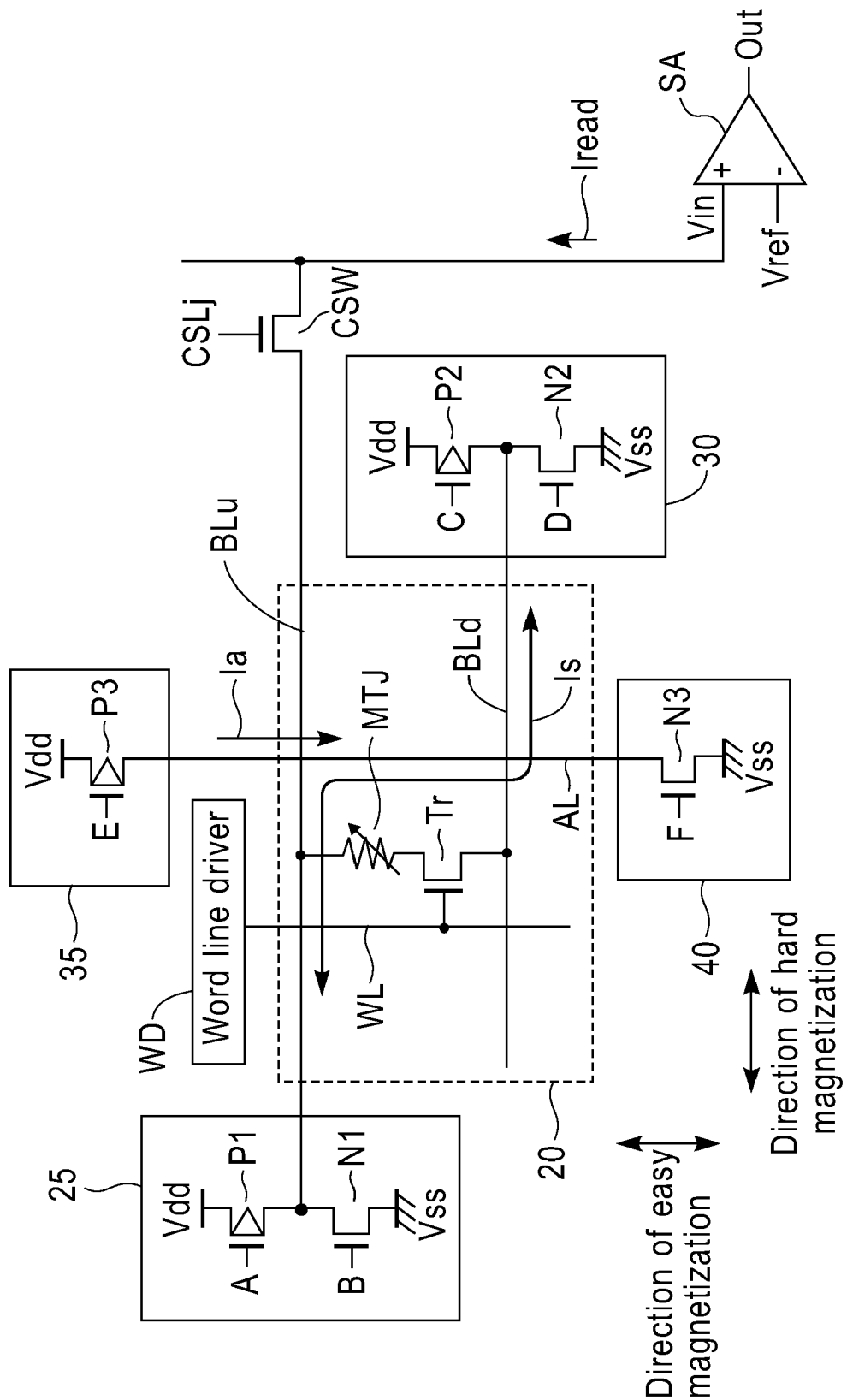
FIG. 1 is a circuit diagram illustrating a conventional MRAM.
Figure 2A:
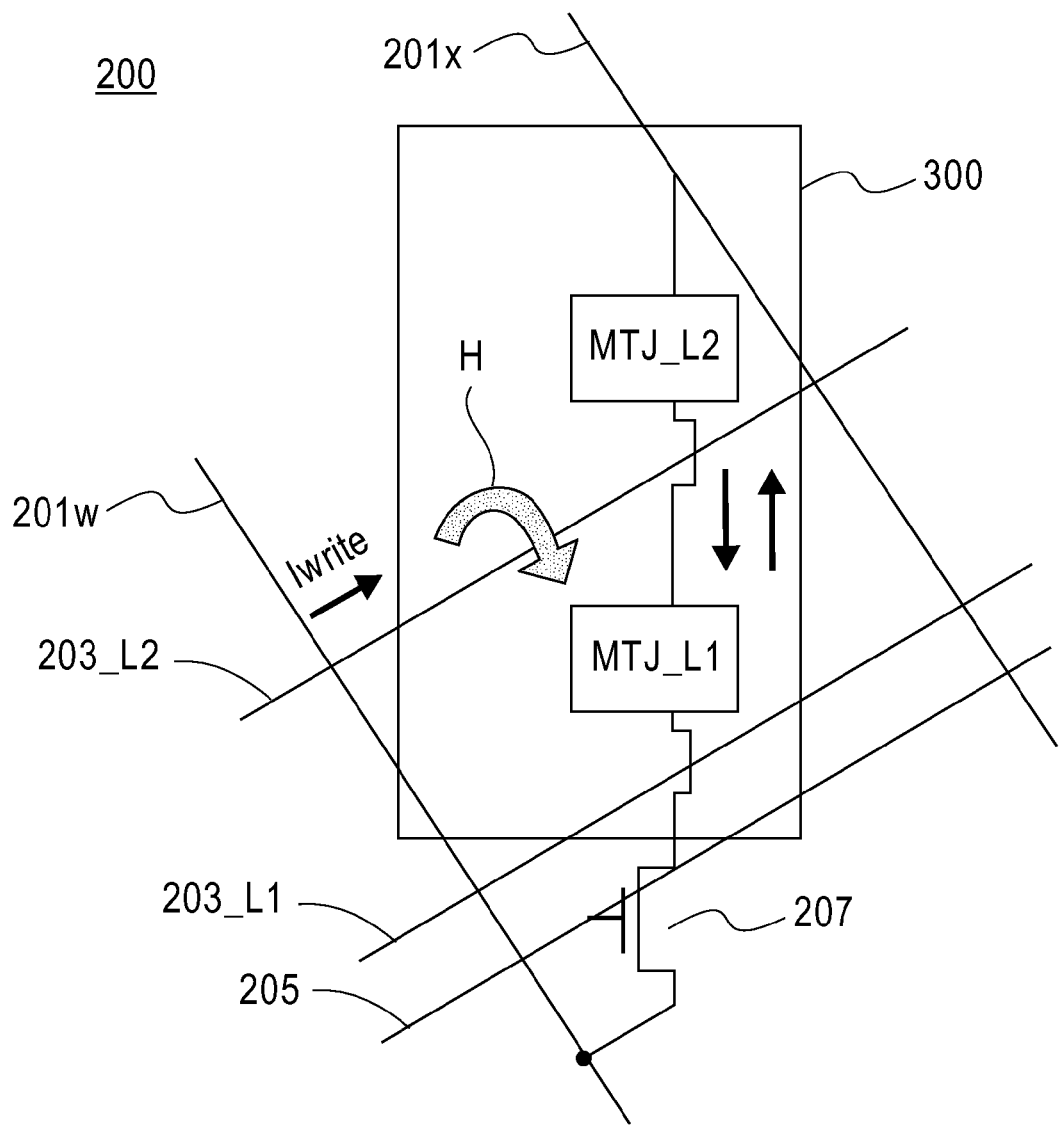
FIGS. 2A and 2B are circuit diagrams illustrating a stacked spin-injected MTJ structure and a memory array of a plurality of memory cells, respectively.

Turning now to the drawings in greater detail, it will be seen that in FIG. 2A, there is a stacked magnetic tunnel junction (MTJ) structure of a multi-layer MRAM. Specifically, FIG. 2A illustrates a stacked spin-injected MTJ memory cell 200 capable of two-bit storage. The memory cell 200 includes a plurality of stacked MTJ devices serially connected to each other including a first MTJ device MTJ_L1 on a first magnetic element layer, a second MTJ device MTJ_L2 on a second magnetic element layer, and an access transistor 207, for example, a field effect transistor (FET) shared by the stacked MTJ devices MTJ_L1 and MTJ_L2. It should be understood that the present invention is not limited to any particular number of MTJ devices. The memory cell 200 is connected to an array of memory cells (see FIG. 2B) via wires including a first write word line 203_L1, a second write word line 203_L2, a read word line 205, a source/sink bit line 201x and a sink/source bit line 201w. According to an exemplary embodiment, a write current $I_{write}$ flows through either the first write word line 203_L1 or the second write word line 203_L2, the write current $I_{write}$ generates a hard axis magnetic field H used to selectively write an MTJ device (i.e., MTJ_L1 or MTJ_L2) of the stacked MTJ devices. That is, the hard axis magnetic field H selects one of the MTJ_L1 or MTJ_L2 for the write operation. The read word line 205 selects the memory cell connected to the bit lines 201w and 201x through which the spin-injection current (illustrated by up and down arrows) passes.

According to an exemplary embodiment, each MTJ device, MTJ_L1 and MTJ_L2 are written to a binary '1' or '0' depending on the polarity of a spin-injection current driven through the respective MTJ device, MTJ_L1 and MTJ_L2.

According to an exemplary embodiment, each MTJ device MTJ_L1 and MTJ_L2 may be written independently of the other by using a hard axis field H to select an MTJ for writing, In the example of FIG. 2A, MTJ_L2 is selected for a write operation.

Figure 2B:
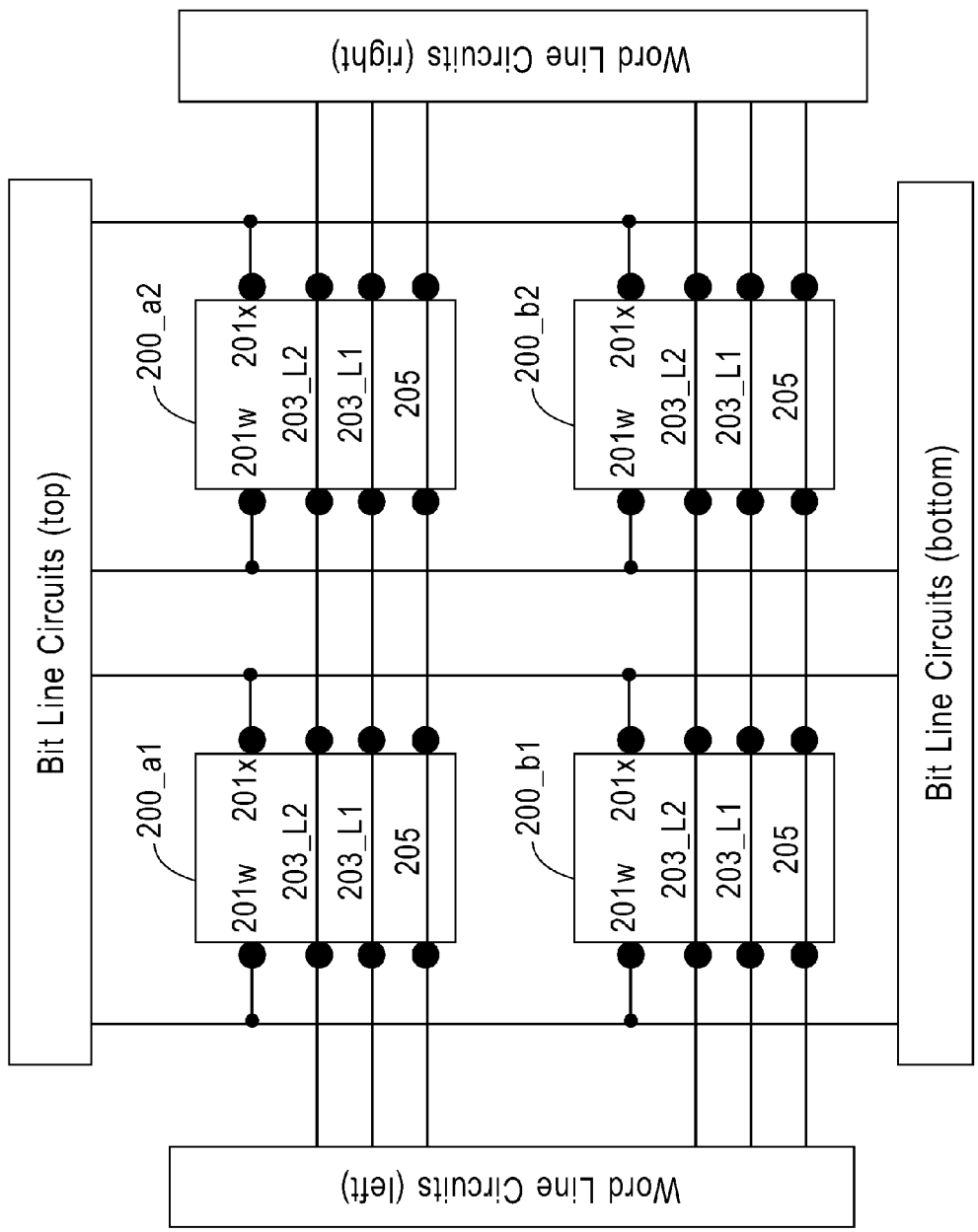

FIG. 2B is a circuit diagram illustrating a memory array of a plurality of memory cells. As shown in FIG. 2B, according to an exemplary embodiment, a plurality of stacked spin-injected MTJ memory cells may be arranged as a memory. The memory circuit includes stacked spin-injected MTJ memory cells 200_a1, 200_a2, 200_b1, 200_b2, word line circuits, and bit line circuits. According to an exemplary embodiment, word line circuits may be disposed at the left side of the memory cells, the right side of the memory cells, or both sides of the memory cells. Bit line circuits may be disposed above and below the memory cells or above or below the memory cells.

Figures 3A, 3B:
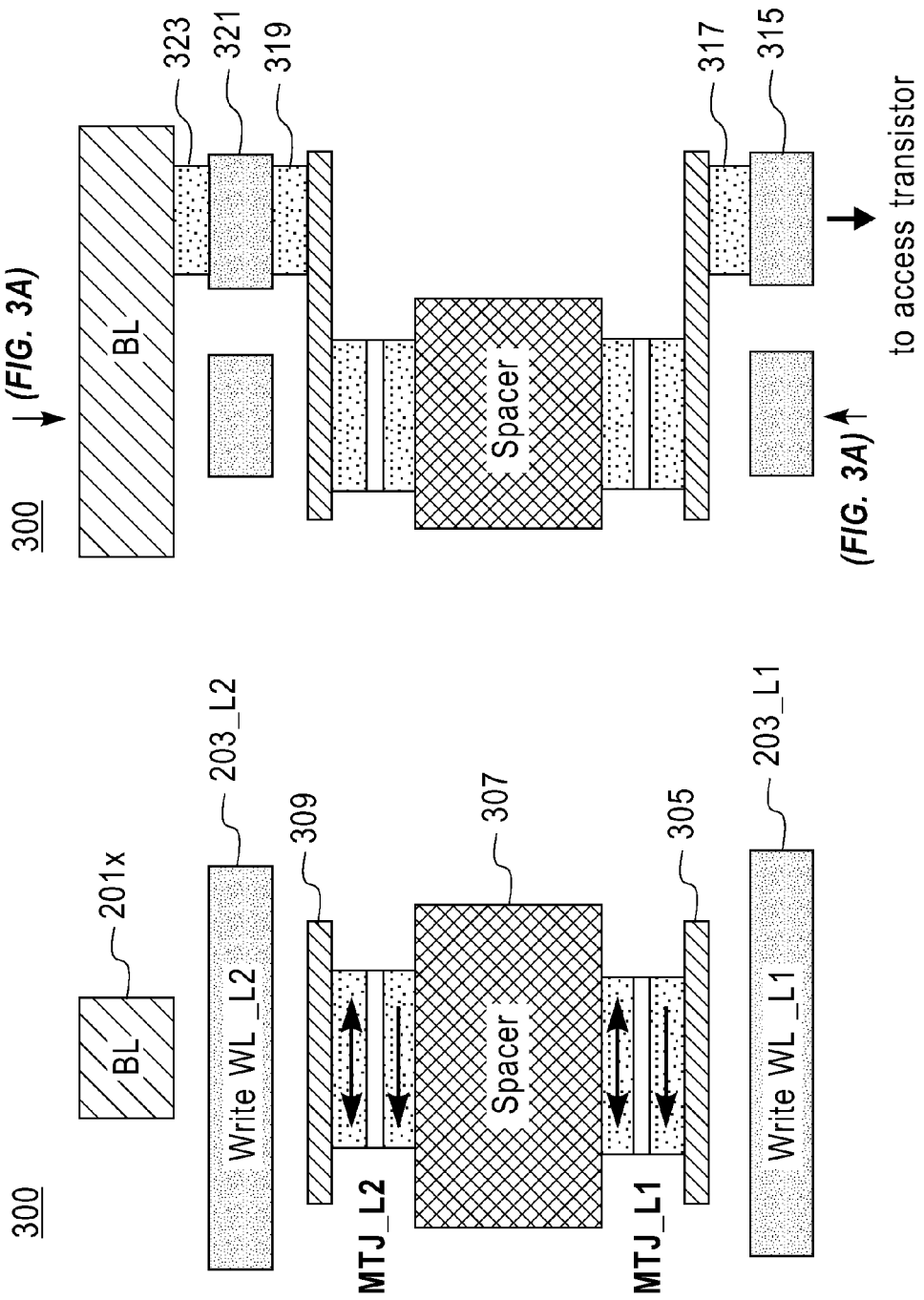
FIGS. 3A and 3B are circuit diagrams illustrating a front-view and a side view of a device structure of stacked MTJ devices, respectively, that can be implemented within embodiments of the present invention.

FIGS. 3A and 3b are front and side views of the stacked MTJ devices of FIG. 2A that can be implemented within embodiments of the present invention. As shown in FIG. 3A, an MTJ stack 300 comprising a first write word line 203_L1 disposed at a first layer L1 and a second write word line 203_L2 disposed at a second layer L2, first MTJ device and second MTJ devices MTJ_L1 and MTJ_L2 (discussed in FIG. 2A) disposed between the first and second write word lines 203_L1 and 203_L2, and a spacer 307 disposed between the first and second MTJ devices MTJ_L1 and MTJ_L2, which creates a predetermined space between the first and second MTJ devices MTJ_L1 and MTJ_L2. The spacer reduces a magnetic coupling from one of the first or second write word lines 203_L1 or 203_L2 to the first or second MTJ device MTJ_L1 or MTJ_L2 which is unselected. The spacer 307 in this embodiment also serves as an electrical conductor that connects MTJ_L1 to MTJ_L2.

When an MTJ device MTJ_L1 or MTJ_L2 of the stacked MTJ devices is selected to be written, the write current $I_{write}$ flows through the respective write word line 203_L1 or 203_L2 to generate a hard axis magnetic field. A cancel current $I_{cancel}$ (see FIG. 6, for example) may also be generated that flows through the respective write word line 203_L1 or 203_L2 of an unselected MTJ device MTJ_L1 or MTJ_L2 to cancel the stray magnetic field of the hard axis magnetic field, which impinges on the unselected MTJ device MTJ_L1 or MTJ_L2.

The MTJ stack 300 further comprises a metal interconnect layer including the first write word line 203_L1 and a pass-through metal interconnect 315, a via 317, and a local thin metal interconnect layer 305. The thin metal interconnect layer 305 connects the via 317 of the interconnect stack to the MTJ_L1 disposed above the first write word line 203_L1. The MTJ stack 300 further comprises MTJ_L1 and a spacer 307 comprising a thick metal layer. According to an exemplary embodiment, a magnetic coupling from the selected write word line, i.e., first write word line 203_L1 or second write word line 203_L2 to the unselected MTJ_L1 or MTJ_L2, respectively, is reduced based on a height of the spacer 307. That is, for example, the spacer 307 is used to reduce the magnitude of the stray magnetic field generated by write word line 203_L1 that couples into the MTJ device MTJ_L2. The coupling field has an inverse dependency on the height (thickness) of the spacer 307. A local thin metal interconnect layer 309 connects from the second MTJ device MTJ_L2. disposed below the second write word line 203_L2, to the via 319. The via 319 connects to a pass-through metal interconnect 321, formed within another metal interconnect layer, that further includes the second write word line 203_L2. A via 323 connects the source/sink bit line 201x formed on yet another metal layer. The entire electrical conduction path from the pass-through metal interconnect 315 to the source/sink bit line 201x comprises the pass-through metal interconnect 315, the via 317, the thin metal interconnect layer 305, the MTJ device MTJ_L1, the spacer 307, the MTJ device MTJ_L2, the thin metal interconnect layer 309, the via 319, the pass-through metal interconnect 321, the via 323 and the source/sink bit line 201x.

Figures 4A, 4B:
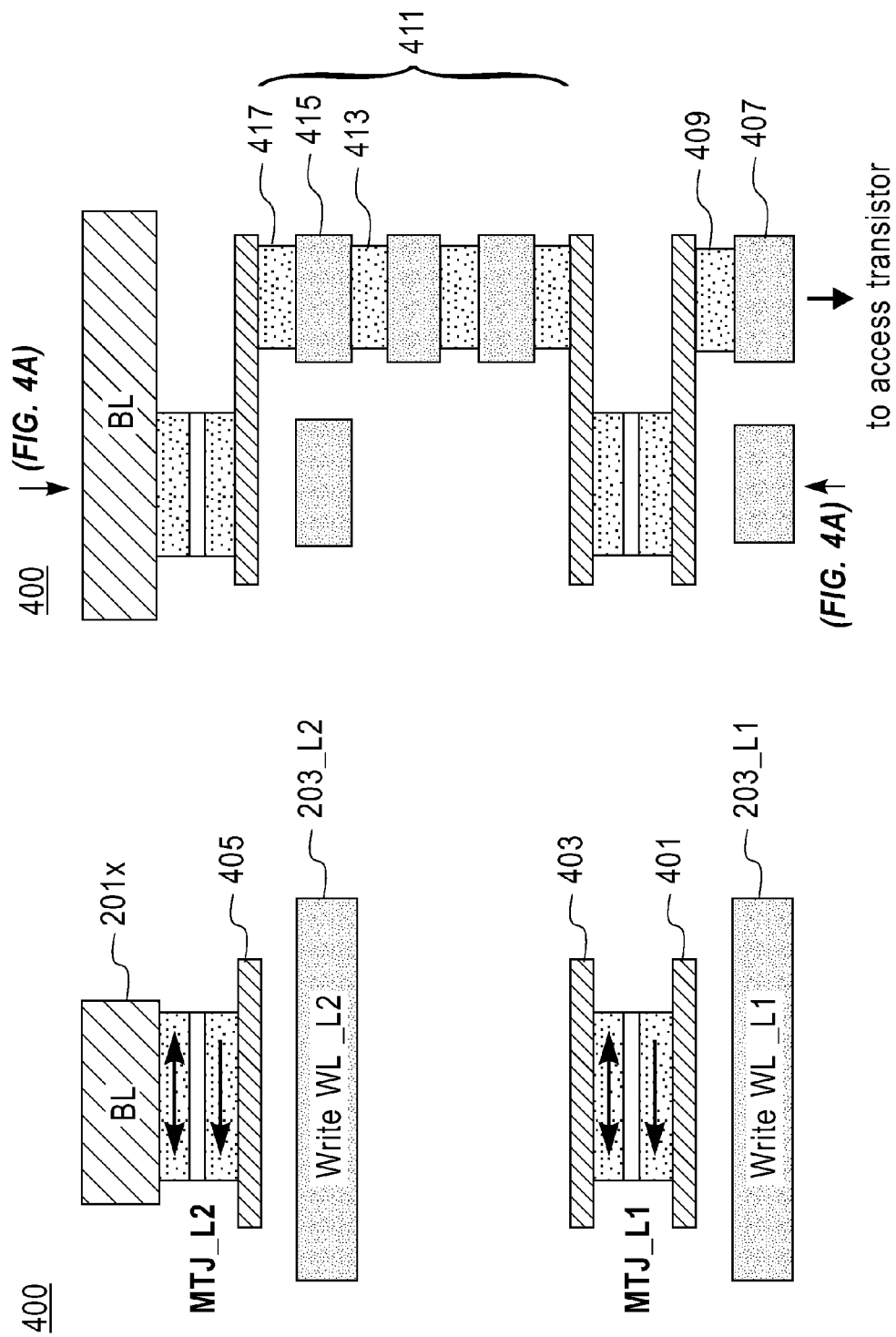
FIGS. 4A and 4B are circuit diagrams illustrating a front view and a side view of a device structure of stacked MTJ devices, respectively, that can be implemented within another embodiment of the present invention.

FIGS. 4A and 4B are front and side views of an MTJ stack 400 according to another exemplary embodiment of the present invention. According to an exemplary embodiment, the MTJ stack 400 comprises the first write word line 203_L1 disposed on a first layer L1 and the second write word line 203_L2 disposed on a second layer L2. The MTJ stack 400 further comprises the first MTJ device MTJ_L1 disposed between the first and second write word lines 203_L1 and 203_L2 and the second MTJ device MTJ_L2 disposed above the second write word line 203_L2 on the second layer L2. A via and interconnect stack 411 creates a space between the first and second MTJ devices MTJ_L1 and MTJ_L2 that reduces a magnetic coupling from the first or second write word lines 203_L1 or 203_L2 to the second or first MTJ device MTJ_L2 or MTJ_L1 respectively.

Further, as shown in FIG. 4A, the MTJ stack 400 comprises a metal interconnect layer that includes the first write word line 203_L1 and a pass-through metal interconnect 407, a via layer 409, and first and second thin metal interconnect layers 401 and 403. In FIG. 4B, the MTJ stack 400 further comprises the via and interconnect stack 411 that includes, for example, a via layer 413, a metal pass-through 415, and via layer 417. The entire electrical conduction path from the pass-through metal interconnect 407 to the source/sink bit line 201x comprises the pass-through metal interconnect 407, the via 409, the thin metal interconnect layer 401, the MTJ device MTJ_L1, the via and interconnect stack 411, the thin metal interconnect layer 405, the MTJ device MTJ_L2, and the source/sink bit line 201x.

Figure 5:
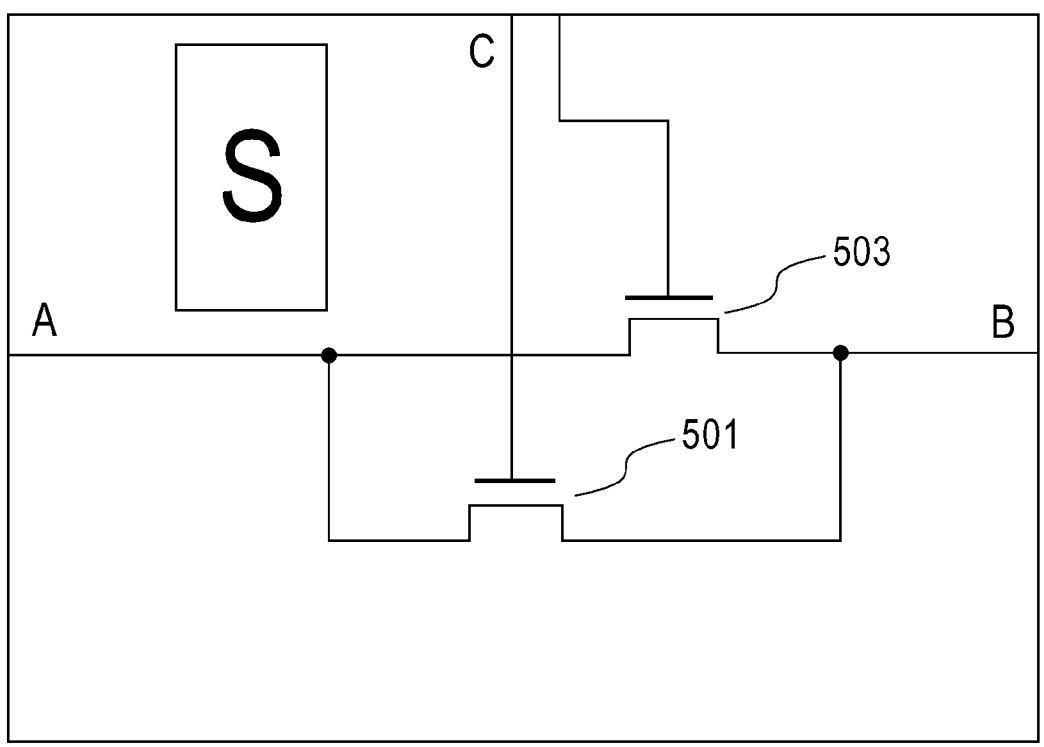
FIG. 5 is a circuit diagram of a selection switch that can be implemented within embodiments of the present invention.
Figure 6:
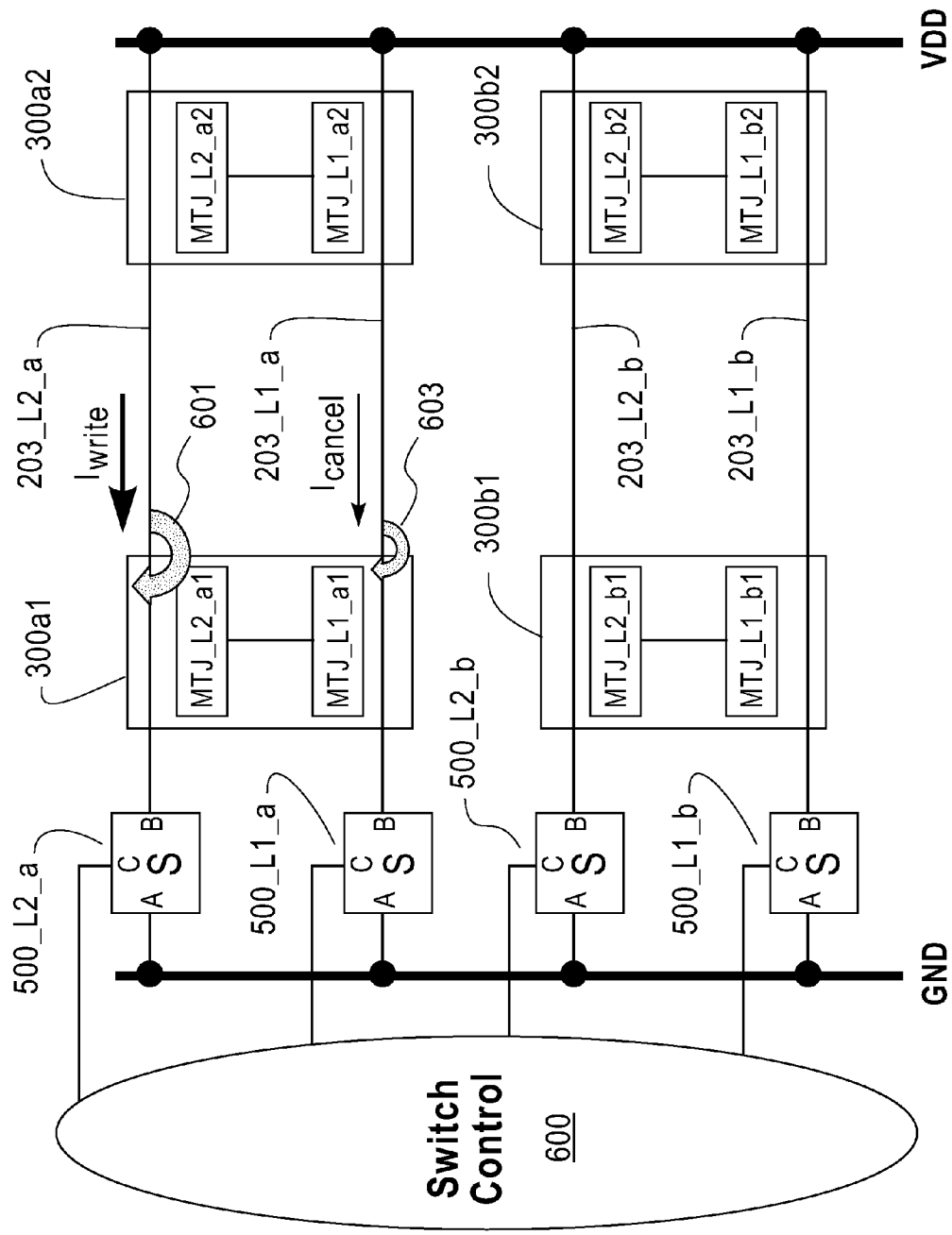
FIG. 6 is a circuit diagram illustrating a magnetic field cancellation operation of unselected MTJ devices of the stacked MTJ devices of FIGS. 3A and 3B that can be implemented within embodiments of the present invention.
Figure 7A:
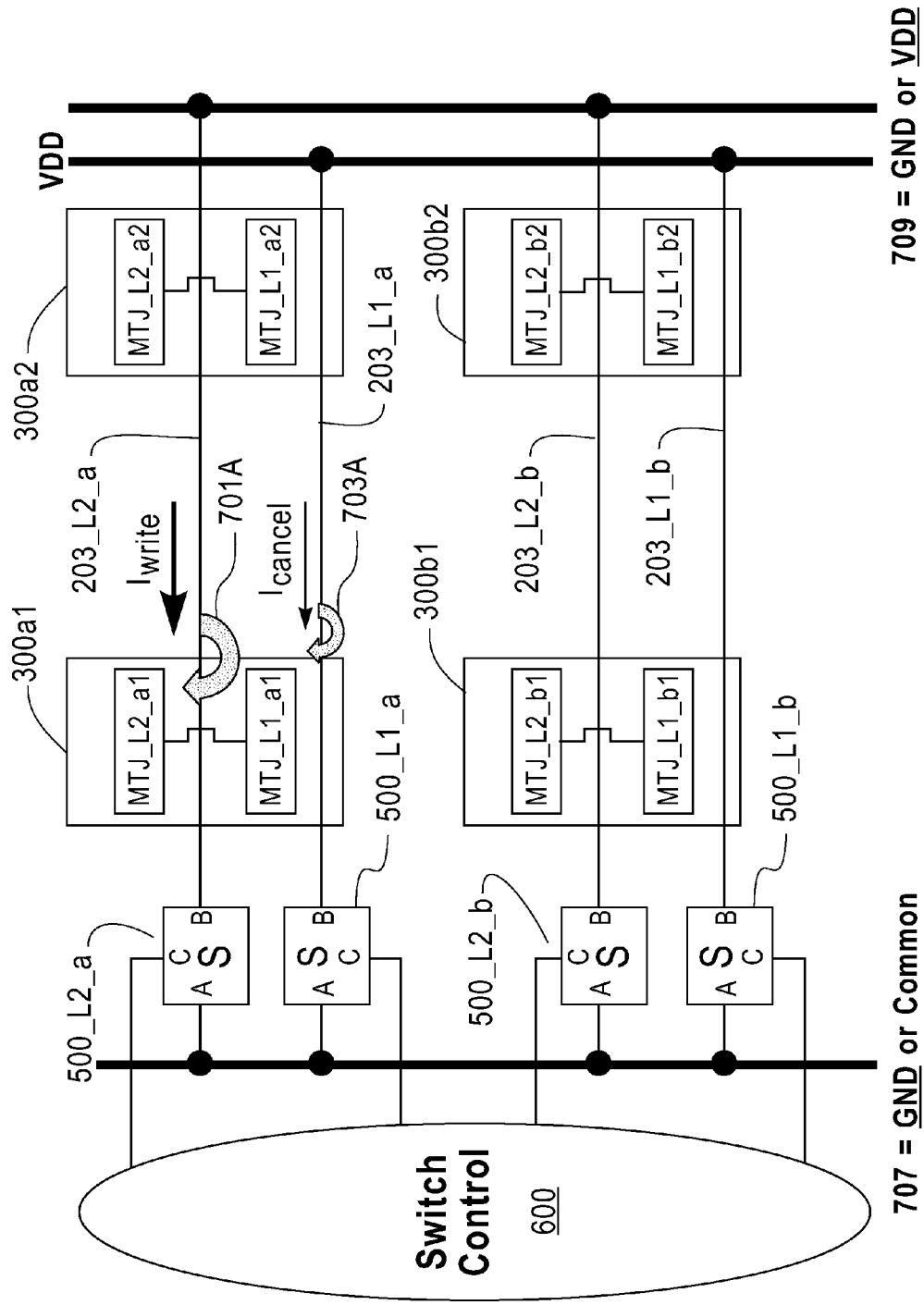
FIGS. 7A and 7B are identical circuit diagrams illustrating unique magnetic field cancellation operations applied to minimize the magnetic field impinging on the unselected MTJ devices of the stacked MTJ devices of FIGS. 4A and 4B that can be implemented within embodiments of the present invention.
Figure 7B:
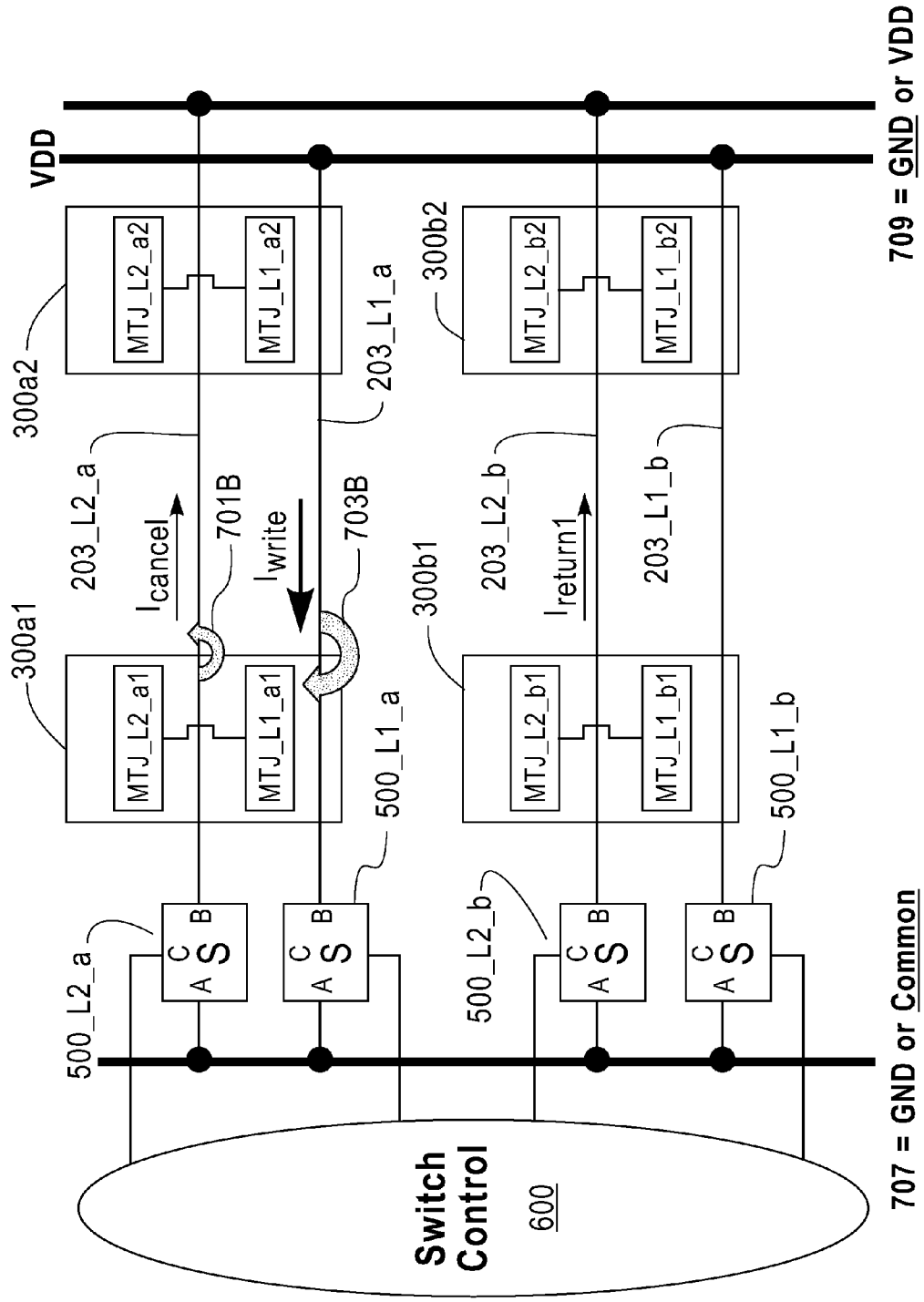

FIG. 5 is a diagram of a selection switch that can be implemented within embodiments of the present invention. As shown in FIG. 5, a switch 500 includes a control gate or a plurality of gates C, which regulate the transconductance between terminals "A" and "B". The transconductance of the switch 500 may be regulated by a digital means or an analog means. For example, the transconductance of the switch 500 may be regulated by a digital means by disabling a N-channel FETs 501 and 503; disabling NFET 503 and enabling NFET 501; enabling NFET 503 and disabling NFET 501; or enabling NFET 503 and enabling NFET 501. The NFETS 501 and 503 may include different transconductances. Alternatively, as mentioned above, the transconductance of the switch 500 may be regulated by an analog means. For example, by applying range of voltage s to the gates of the NFETs 501 and 503. According to an exemplary embodiment, the switch 500 includes a broad ranging conductance to regulate current which flows through write word lines (see FIGS. 6 and 7A and 7B to be discussed below). By controlling the magnitude of the write currents, the stray magnetic field in the MTJ stack 300 may be almost entirely nullified. FIGS. 6, 7A and 7B illustrate a stacked MTJ structure of a multi-layer MRAM where the MTJ devices are serially connected to each other. A switching network (to be discussed below) sources a first current i.e., a write current $I_{write}$ on one of the first or second layers to select an MTJ device of the stacked MTJ devices for writing and sources a second current i.e., a cancel current $I_{cancel}$ on the other of the first or second layers to cancel a magnetic field produced by the write current $I_{write}$ that also impinges on an unselected MTJ device of the stacked MTJ devices. The write current $I_{write}$ has a greater magnitude than that of the cancel current $I_{cancel}$.

FIG. 6 is a circuit diagram illustrating a magnetic field cancellation operation of unselected MTJ devices of the stacked MTJ devices of FIGS. 3A and 3B that can be implemented within embodiments of the present invention. The circuit shown in FIG. 6 is used to cancel stray hard axis magnetic field that impinges on an unselected MTJ device of FIGS. 3A and 3B, for example. FIG. 6 illustrates a plurality of memory element pairs 300a1, 300a2, 300b1 and 300b2, a plurality of selection switches 500_L1_a, 500_L1_b, 500_L2_a and 500_L2_b controlled by a switch control 600, each switch 500_L1_a, 500_L1_b, 500_L2_a and 500_L2_b includes the same features as that of the selection switch 500 shown in FIG. 5, therefore a description thereof is not repeated. Also shown in FIG. 6 are a plurality of write word lines 203_L1_a, 203_L1_b, 203_L2_a and 203_L2_b corresponding to each layer L1 and L2 in the multi-layer MRAM. According to an exemplary embodiment, each memory element pair 300a1, 300a2, 300b1 and 300b2 respectively comprises a pair of MTJ devices: the first pair being MTJ_L1_a1 and MTJ_L2_a1; the second pair being MTJ_L1_a2 and MTJ_L2_a2 the third pair being MTJ_L1_b1 and MTJ_L2_b1; and the fourth pair being MTJ_L1_b2 and MTJ_L2_b2.

According to the current exemplary embodiment shown in FIG. 6, the stacked MTJ devices are disposed between the first and second layers L1 and L2, and the switching network comprises the switch control 600 and the plurality of switches 500_L1_a, 500_L1_b, 500_L2_a and 500_L2_b which regulate the flow or control the generation of the write current $I_{write}$ and the cancel current $I_{cancel}$.

As shown in FIG. 6, MTJ devices MTJ_L2_a1 and MTJ_L2_a2 are selected for writing. Essentially, the write current $I_{write}$ flows through the write word line 203_L2_a and generates a hard axis magnetic field 601 that selects the aforementioned MTJ devices for writing. At the same time, a stray magnetic field of the hard axis magnetic field 601 spills over into the unselected MTJ devices MTJ_L1_a1 and MTJ_L1_a2, and partially selects these unselected MTJ devices for writing. In order to avoid switching the unselected MTJ devices MTJ_L1_a1 and MTJ_L1_a2, a cancel current $I_{cancel}$ is used to generate an opposing magnetic field 603 to counterbalance the stray magnetic field of the hard axis magnetic field 601 such that the net hard axis magnetic field on MTJ devices MTJ_L1_a1 and MTJ_L1_a2 is zero. That is, the hard axis magnetic field is "zeroed out" on the unselected MTJ devices MTJ_L1_a1 and MTJ_L1_a2.

It has been noted previously that the selected MTJ, for example MTJ_L2_a1, is written to a specific binary state controlled solely by the direction or sign of the current driven through both MTJ devices MTJ_L2_a1 and MTJ_L1_a1 of the memory element pair 300a1. Of course, if the hard axis field on the unselected MTJ MTJ_L1_a1 is large enough, it too may be written to the binary state defined by the sign of the current driven through the memory element pair 300a1. Ambient thermal energy helps lower the potential barrier for switching the MTJ device so it will switch at lower field strengths than the magnetic moment or inertia would indicate. Hence, the field cancellation embodiments described herein coupled with the physical spacing between MTJs renders stacking scheme of spin-torque MTJs viable/practical.

According to the current exemplary embodiment, the MTJ devices of FIG. 6 are disposed between the write word lines. Further, the write current $I_{write}$ and the cancel current $I_{cancel}$ flow in a same direction.

Further, the switch control 600 activates switches 500_L2_a and 500_L2_a, respectively, and adjusts their respective transconductances to regulate the magnitude of the write current, $I_{write}$, and the cancel current, $I_{cancel}$.

Further, according to an exemplary embodiment, in order to write MTJ devices MTJ_L1_a1 and MTJ_L1_a2, the write current $I_{write}$ is applied through the write line 203_L1_a and the cancel current $I_{cancel}$ is then be applied through the write word line 203_L2_a. According to an exemplary embodiment, the field cancellation operation shown in FIG. 6, may not only be applied to spin-torque MTJ devices which are stacked and switched, in part, by a hard axis magnetic field, but may also be applied to MTJ devices that are written entirely by applied magnetic fields.

FIGS. 7A and 7B are circuit diagrams illustrating a magnetic field cancellation operation of unselected MTJ devices of the stacked MTJ devices of FIGS. 4A and 4B that can be implemented within embodiments of the present invention. FIGS. 7A and 7B include some of the same features shown in FIG. 6 and the same reference numerals represent the same features, therefore, a description thereof has been omitted. Specifically, FIGS. 7A and 7B illustrate the cancelling of stray hard-axis magnetic fields that impinge on unselected MTJ devices as shown in FIGS. 4A and 4B, for example. Specifically, the cancel current $I_{cancel}$ reverses direction from FIG. 7A where cases in which the layer 2 MTJ devices MTJ_L2_a1 and MTJ_L2_a2 are written to FIG. 7B where the layer 1 MTJ devices MTJ_L1_a1 and MTJ_L1_a2 are written. The reversal of the cancellation current is mandated by the relative orientation of the MTJ devices to the write word lines. In FIGS. 7A and 7B, one of the MTJ devices in the stacked MTJ devices is disposed between the first and second write word lines 203_L1_a and 203_L2_a and the other of the MTJ devices is disposed above the second write word line 203_L2_a. In contrast to FIG. 7, the cancellation currents $I_{cancel}$ of FIG. 6 are always driven in the same direction as the write current $I_{write}$ because the MTJ devices are sandwiched between the write word lines.

Referring to FIG. 7A, as shown, the switch control 600 activates switches 500_L1_a and 500_L2_a and adjusts their respective transconductances to generate the write current $I_{write}$ and the cancel current $I_{cancel}$ and maintains switches 500_L1_b and 500_L2_b in a disabled state such that current does not flow through write word lines 203_L1_b and 203_L2_b. Further, according to the current exemplary embodiment, a common-ground node 707 is set to ground and a ground-vdd node 709 is set to a high voltage supply.

As shown in FIG. 7A, during a write operation of MTJ devices MTJ_L2_a2 and MTJ_L2_a1, the write current $I_{write}$ flowing through the write word line 203_L2_a generates a hard axis magnetic field 701a which selects an MTJ device to be written. At the same time, stray magnetic field of the hard axis magnetic field 701a spills over in the unselected MTJ devices MTJ_L1_a1 and MTJ_L2_a1 and partially selects these MTJ devices for writing. To avoid switching the unselected MTJ devices, the cancel current $I_{cancel}$ generates an opposing magnetic field 703a to counterbalance the stray magnetic field of the hard axis magnetic field 701a, and zeros out the stray magnetic field on the unselected MTJ devices MTJ_L1_a1 and MTJ_L2_a1. In this current exemplary embodiment, the write current $I_{write}$ and the cancel current $I_{cancel}$ travel in a same direction.

According to another exemplary embodiment, as shown in FIG. 7B, the write current $I_{write}$ and the cancel current $I_{cancel}$ travel in opposite directions. As shown in FIG. 7B, when writing MTJ devices MTJ_L1_a1 and MTJ_L1_a2 on layer 1, the switch control 600 activates switches 500_L1_a and 500_L2_a and adjust their respective transconductances to generate the write current $I_{write}$ and the cancel current $I_{cancel}$, respectively.

As shown in FIGS. 7A and 7B, according to an exemplary embodiment, a direction of the cancel current $I_{cancel}$ changes depending on a layer the selected MTJ device for writing is disposed.

In the current exemplary embodiment, the cancel current $I_{cancel}$ is reversed in direction compared to that of FIG. 6, and the switch control 600 returns a fraction of the write current $I_{write}$ not used as cancel current $I_{cancel}$ to node 709, which has been set to GND. This current will be referred to as a return current $I_{return1}$ in FIG. 7B. For this particular write operation, it should also be noted that node 707 has been set to "common" and, hence, is used to connect the switches 500_L2_a, 500_L1_a, 500_L2_b, and 500_L1_b (without shunting them to GND).

The return current $I_{return1}$ passes through the write word line 203_L2_b on its return to ground GND. According to an exemplary embodiment, multiple return paths are available to ensure that the hard axis magnetic field generated by each return current does not impact the stability of the MTJ devices. In the current exemplary embodiment, the write current $I_{write}$ is equal to the sum of the cancel current $I_{cancel}$ and all other return currents $I_{return1}$ through say $I_{returnN}$.

One unique feature of the current switching structure depicted in FIGS. 7A and 7B is that it enables the necessary reversal of the cancel current $I_{cancel}$ with respect to the write current $I_{write}$ using only one switch (e.g. 500_L2_a, 500_L1_a, 500_L2_b, 500_L1_b) per write word line (e.g. 203_L2_a, 203_L1_a, 203_L2_b, 203_L1_b).

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A stacked magnetic tunnel junction structure of a multi-layer magnetic random access memory comprising:
   a plurality of stacked magnetic tunnel junction devices serially connected to each other, and an access transistor shared between the stacked magnetic tunnel junction devices; and
   a write word line through which a write current flows, the write current generating a hard axis magnetic field used to selectively write a magnetic tunnel junction device of the stacked magnetic tunnel junction devices, wherein when a magnetic tunnel junction device of the stacked magnetic tunnel junction devices is selected to be written and the write current flows through the respective write word line to generate a hard axis magnetic field, a cancel current is generated and flows through the respective write word line of an unselected magnetic tunnel junction device to cancel stray magnetic field of the hard axis magnetic field which impinges on the unselected magnetic tunnel junction device.

2. The stacked magnetic tunnel junction structure of claim 1, wherein each magnetic tunnel junction device is independently written.

3. The stacked magnetic tunnel junction structure of claim 1, further comprising:
   a first write word line disposed at a first layer and a second write word line disposed at a second layer;
   a first magnetic tunnel junction device and a second magnetic tunnel junction device disposed between the first and second write word lines; and
   a spacer disposed between the first and second magnetic tunnel junction devices, which creates a predetermined space between the first and second magnetic tunnel junction devices and reduces a magnetic coupling from one of the first or second write word lines to the first or second magnetic tunnel junction device which is unselected.

4. The stacked magnetic tunnel junction structure of claim 1, further comprising:
   a first write word line disposed on a first layer and a second write word line disposed on a second layer; and
   a first magnetic tunnel junction device disposed between the first and second write word lines and a second magnetic tunnel junction device disposed above the second write word line on the second layer to create a space between the first and second magnetic tunnel junction devices and reduces a magnetic coupling from the first or second write word lines to the first or second magnetic tunnel junction device which is unselected.

5. The stacked magnetic tunnel junction structure of claim 1, wherein the magnetic tunnel junction devices are disposed between a plurality of write word lines.

6. A stacked magnetic tunnel junction structure of a multi-layer magnetic random access memory having first and second layers, comprising:
   a plurality of stacked magnetic tunnel junction devices serially connected to each other; and
   a switching network which sources a first current on one of the first or second layers to select a magnetic tunnel junction device of the stacked magnetic tunnel junction devices for writing and sources a second current on the other of the first or second layers to cancel a magnetic field produced by the first current which impinges on an unselected magnetic tunnel junction device of the stacked magnetic tunnel junction devices, the first current having a greater magnitude than that of the second current.

7. The stacked magnetic tunnel junction structure of claim 6, wherein:
   the stacked magnetic tunnel junction devices are disposed between the first and second layers; and
   the switching network comprises a switch control and a plurality of switches which control generation of the first current and the second current; and
   a plurality of write word lines disposed at the first and second layers, respectively,
   the first current flowing through one of the write word lines and generating a hard axis magnetic field to select a magnetic tunnel junction device of the stacked magnetic tunnel junction devices for writing, and the second current flowing through another of the write word lines to cancel a stray magnetic field of the hard axis magnetic field which impinges on the unselected magnetic tunnel junction device of the stacked magnetic tunnel junction devices.

8. The stacked magnetic tunnel junction structure of claim 7, wherein the first and second currents flow in a same direction.

9. The stacked magnetic tunnel junction structure of claim 6, wherein:
   one of the magnetic tunnel junction devices in the stacked magnetic tunnel junction devices is disposed between the first and second layers and the other of the magnetic tunnel junction devices is disposed above the second layer;
   the switching network comprises a switch control and a plurality of switches which control generation of the first current and the second current; and
   a plurality of write word lines disposed at the first and second layers, respectively; and
   the first current flowing through one of the write word lines and generating a hard axis magnetic field to select a magnetic tunnel junction device of the stacked magnetic tunnel junction devices for writing, and the second current flowing through another of the write word lines to cancel a stray magnetic field of the hard axis magnetic field which impinges on the unselected magnetic tunnel junction device of the stacked magnetic tunnel junction devices.

10. The stacked magnetic tunnel junction structure of claim 9, wherein a direction of the second current changes depending on a layer the selected magnetic tunnel junction device for writing is disposed, wherein when the selected magnetic tunnel junction device is on the first layer, the first current flows through a write word line on the first layer, and the second current flows on a write word line of the second layer and the direction of the second current is opposite of that of the first current.

11. The stacked magnetic tunnel junction structure of claim 10, wherein when the selected magnetic tunnel junction device is disposed above the second layer, the first current flows through the write word line on the second layer, and the second current flows on the write word line of the first layer, and the first and second currents flow in a same direction.

12. The stacked magnetic tunnel junction structure of claim 10, wherein when the second current is reversed in an opposite direction of that of the first current and any return current other than the first current and the second current is returned along multiple paths to ground.

13. The stacked magnetic tunnel junction structure of claim 12, wherein the first current is equal to a sum of the second current and any return current.

14. A write method for selectively writing a magnetic tunnel junction device of stacked magnetic tunnel junction devices, the method comprising:
   selecting a magnetic tunnel junction device of the stacked magnetic tunnel junction devices for writing data;
   generating a write current to flow through a first write word line corresponding to the MTJ device selected to generate a hard axis magnetic field which selects the magnetic tunnel junction device for writing;
   generating a cancel current to flow through a second write word line corresponding to an unselected magnetic tunnel junction device of the stacked magnetic tunnel junction devices to generate an opposing magnetic field to counterbalance a stray magnetic field of the hard axis magnetic field which impinges on the unselected magnetic tunnel junction device.

15. The method of claim 14, further comprising:
controlling a plurality of switches, each switch corresponding to the respective first or second write word line and controlling the generation of the write current and the cancel current, respectively; and
disabling other switches of the plurality switches.

16. The method of claim 14, further comprises:
disposing the magnetic tunnel junction devices of the stacked magnetic tunnel junction devices between the first and second write word lines.

17. The method of claim 14, further comprises:
disposing one of the magnetic tunnel junction devices of the stacked magnetic tunnel junction devices between the first and second write word lines and the other magnetic tunnel junction device of the stacked magnetic tunnel junction devices above the second write word line.

18. The method of claim 14, generating a cancel current comprises:
reversing a direction of the cancel current such that the direction of the cancel current is opposite that of the write current, based on layer on which the selected magnetic tunnel junction device is disposed.

* * * * *